(12) United States Patent
Komatsu et al.

(10) Patent No.: US 7,180,110 B2
(45) Date of Patent: Feb. 20, 2007

(54) ORGANIC PHOTOELECTRIC CONVERSION ELEMENT

(75) Inventors: Takahiro Komatsu, Kasuga (JP); Kei Sakanoue, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 9 days.

(21) Appl. No.: 10/885,137

(22) Filed: Jul. 7, 2004

(65) Prior Publication Data

US 2005/0022856 A1    Feb. 3, 2005

(30) Foreign Application Priority Data

Jul. 8, 2003    (JP) .................... P.2003-193431

(51) Int. Cl.
  H01L 31/062    (2006.01)
  H01L 31/113    (2006.01)
  H01L 31/06     (2006.01)
  H01L 29/417    (2006.01)
  H01L 31/00     (2006.01)

(52) U.S. Cl. .............. 257/291; 257/113; 257/215; 257/292; 257/293; 257/294; 257/431; 257/436; 257/462

(58) Field of Classification Search ............ 257/113, 257/215, 291, 431, 436, 292–294, 462
See application file for complete search history.

(56) References Cited

U.S. PATENT DOCUMENTS

| 4,597,161 | A | * | 7/1986  | Yamazaki ............... 438/80 |
| 4,622,432 | A | * | 11/1986 | Yamazaki ............... 136/246 |
| 5,060,040 | A | * | 10/1991 | Saika et al. ............ 257/53 |
| 5,126,802 | A | * | 6/1992  | Yoshikawa et al. ...... 257/40 |
| 5,128,735 | A | * | 7/1992  | Ohmi et al. ............. 257/462 |
| 5,164,322 | A | * | 11/1992 | Yamazaki et al. ....... 438/73 |
| 5,216,331 | A | * | 6/1993  | Hosokawa et al. ...... 315/169.3 |
| 5,264,048 | A | * | 11/1993 | Yoshikawa et al. ...... 136/263 |

(Continued)

FOREIGN PATENT DOCUMENTS

EP    1289028    3/2003

(Continued)

OTHER PUBLICATIONS

M.K. Nazeeruddin, et al., entitled "Conversation of Light to Electricity by cis-$X_2$Bis (2,2'-bipyridyl-4,4'-dicarboxylate) ruthenium (II) Charge-Transfer Sensitizers ($X = Cl^-, Br^-, I^-, CN^-$, and $SCN^-$) on Nanocrystalline $TiO_2$ Electrodes", J. Am. Chem. Soc. 1993, pp. 6382-6390.

(Continued)

*Primary Examiner*—Ida M. Soward
(74) *Attorney, Agent, or Firm*—Greenblum & Bernstein, P.L.C.

(57) ABSTRACT

The organic photoelectric conversion element according to the invention has enhanced the light-absorbing property by incorporating two or more kinds of electron donating organic materials 4a and 4b in the photoelectric conversion region 14. With such measure, it has become possible to efficiently absorb the incident light and enhance the photoelectric conversion characteristic. In addition, a light-to-light conversion material 7 is incorporated in the photoelectric conversion region, too. With this measure, even the light of such a wavelength that an electron donating organic material cannot inherently absorb comes to be absorbed since the light-to-light conversion material 7 converts the wavelength, thus enabling the light to be utilized for carrier generation. Accordingly, an organic photoelectric conversion element with a high conversion efficiency can be obtained.

24 Claims, 2 Drawing Sheets

U.S. PATENT DOCUMENTS

| | | | | |
|---|---|---|---|---|
| 5,311,038 | A | * | 5/1994 | Yamamoto et al. ............ 257/40 |
| 5,331,183 | A | | 7/1994 | Sariciftci et al. ............. 257/40 |
| 5,350,459 | A | * | 9/1994 | Suzuki et al. ............... 136/263 |
| 5,454,880 | A | | 10/1995 | Sariciftci et al. ............ 136/263 |
| 5,698,048 | A | * | 12/1997 | Friend et al. ............... 136/263 |
| 5,710,484 | A | | 1/1998 | Iwanaga et al. ............ 313/504 |
| 6,081,632 | A | * | 6/2000 | Yoshimura et al. ............ 385/5 |
| 6,198,853 | B1 | * | 3/2001 | Yamada ........................ 385/2 |
| 6,233,027 | B1 | * | 5/2001 | Unno et al. ................... 349/25 |
| 6,300,612 | B1 | | 10/2001 | Yu .......................... 250/208.1 |
| 6,917,058 | B2 | * | 7/2005 | Niigaki et al. .............. 257/103 |
| 2002/0055015 | A1 | | 5/2002 | Sato et al. .................. 428/690 |
| 2002/0090772 | A1 | * | 7/2002 | Higashi ...................... 438/166 |
| 2003/0000565 | A1 | * | 1/2003 | Hayashi et al. ............ 136/244 |
| 2003/0098475 | A1 | * | 5/2003 | Ueda .......................... 257/233 |
| 2003/0180998 | A1 | * | 9/2003 | Yokohama et al. ......... 438/200 |
| 2003/0189235 | A1 | * | 10/2003 | Watanabe et al. ........... 257/432 |
| 2004/0165102 | A1 | | 8/2004 | Komatsu et al. ............ 348/370 |
| 2005/0005964 | A1 | | 1/2005 | Komatsu et al. ............ 136/263 |
| 2005/0061364 | A1 | * | 3/2005 | Peumans et al. ............ 136/263 |
| 2005/0173712 | A1 | * | 8/2005 | Nakajima .................... 257/81 |
| 2005/0195318 | A1 | | 9/2005 | Komatsu et al. ............ 348/370 |
| 2005/0217722 | A1 | | 10/2005 | Komatsu et al. ............ 136/263 |

FOREIGN PATENT DOCUMENTS

| | | |
|---|---|---|
| EP | 1353388 | 10/2003 |
| EP | 1447860 A1 * | 8/2004 |
| JP | 61-27675 | 2/1986 |
| JP | 4-86155 | 3/1992 |
| JP | 8-500701 | 1/1996 |
| WO | 94/05045 | 3/1994 |

OTHER PUBLICATIONS

P. Peumans et al., entitled "Very-high-efficiency double-heterostructure copper phthalocyanine/$C_{60}$ photovoltaic cells", Applied Physics Letters, vol. 79, No. 1, Jul. 2, 2001, pp. 126-128.

G. Yu, et al., entitled "Polymer Photovoltaic Cells: Enhanced Efficiencies via a Network of Internal Donor-Acceptor Heterojunctions", Science, vol. 270, Dec. 15, 1995, pp. 1789-1791.

Gang Yu et al., "High Sensitivity Polymer Photosensors for Image Sensing Applications," Synthetic Metals 102, pp. 904-907 (1999).

S. Tokito et al., "Metal Oxides as a Hole-Injecting Layer for an Organic Electroluminescent Device," Journal of Physics D. Applied Physics, IOP Publishing, Bristol GB, vol. 29, No. 11, pp. 2750-2753, XP 000694594 (Nov. 14, 1996).

English language Abstract of JP 4-86155.

English language Abstract of JP 61-027675.

* cited by examiner

ORGANIC PHOTOELECTRIC CONVERSION ELEMENT

BACKGROUND OF THE INVENTION

The present invention relates to an organic photoelectric conversion element using a photovoltaic effect of an organic semiconductor material.

An organic photoelectric conversion element supplies electric power outside the element by making use of the photovoltaic effect of an organic semiconductor sandwiched between electrodes. Since such an organic photoelectric conversion element has many advantages such as a lower energy cost for manufacture and a lower environmental load for disposal than those of, for example, photodiodes using conventional inorganic semiconductors, studies for practical application are being made.

There are many types of the organic photoelectric conversion element, including a wet type reported by Gratzel et al. (See, for example, non-patent literature 1.), a type based on a stacked structure (See, for example, non-patent literature 2.), and one based on the mixture of an electron donating organic matter and an electron accepting organic matter (See, for example, non-patent literature 3.).

Here, explanation will be given on the configuration of a conventional organic photoelectric conversion element. FIG. 6 is a cross-sectional view of the essential part of a conventional organic photoelectric conversion element. In FIG. 6, 1 indicates a substrate, 2 an anode, 3 a photoelectric conversion region, 4 an electron donating layer comprising an electron donating organic material, 5 an electron accepting layer comprising an electron accepting material, and 6 a cathode, respectively.

The organic photoelectric conversion element, as depicted in FIG. 6, has the anode 2 comprising the light-transmitting substrate 1 made of, for example, glass, and a transparent conductive film, provided on the support 1, made of, for example, ITO fabricated by, for example, sputtering, resistive heating vapor deposition, photoelectric conversion region 3 fabricated in the form of a film, by providing the electron donating layer 4 and electron accepting layer 5 on anode 2 respectively by, for example, resistive heating vapor deposition, and the cathode 6 made of a metal provided thereon by, for example, resistive heating vapor deposition. When the organic photoelectric conversion element having the aforementioned configuration is subjected to light irradiation, light absorption takes place in the photoelectric conversion region 3 to give rise to excitons. In succession, carriers are separated whereby electrons move towards the cathode 6 through the electron accepting material 5 and holes move towards the anode 2 through the electron donating layer 4. Via such process, an electromotive force generates between the two electrodes, and thus it becomes possible to take out an electric power by connecting an external circuit to the element.

[NON-PATENT LITERATURE 1]

M. K. Nazeeruddin, A. Kay, I. Rodicio, R. Humphry-Baker, E. Mueller, P. Liska, N. Vlachopoulos & M. Graetzel, "Journal of the American Chemical Society", 115, 1993, p. 6382–6390.

[NON-PATENT LITERATURE 2]

P. Peumans & S. R. Forrest, "Applied Physics Letters", 79, 2001, p. 126–128.

[NON-PATENT LITERATURE 3]

G. Yu, J. Gao, J. C. Hummelen, F. Wudl & A. J. Heeger, "Science", 270, 1995, p. 1789–1791.

To enhance the efficiency of an organic photoelectric conversion element, effective light absorption resulting from matching the light absorption characteristic of the photoelectric conversion region with the spectrum of the incident light, investigation of material design as well as device structure enabling effective charge separation, and further efficient carrier transport caused by the enhancement of the carrier mobility of the constituent material are necessary. And, all of these techniques are being devotedly studied.

Among them, increase of the amount of light absorption by matching the light absorption characteristic of the photoelectric conversion region with the spectrum of the incident light is a very important factor for effective conversion of light energy to electric power. However, there has been a problem that an ordinary organic material is difficult to absorb the light covering a broad wavelength range by itself, and thus cannot generate carriers efficiently, leading to the deterioration of conversion efficiency.

SUMMARY OF THE INVENTION

The invention, which is to solve the aforementioned problem, has a purpose of providing an organic photoelectric conversion element which behaves as a highly efficient photoelectric conversion device capable of efficiently absorbing the incident light.

The organic photoelectric conversion element of the invention has improved the light absorption characteristic thereof by incorporating two or more electron donating organic materials in the photoelectric conversion region, thus improving the photoelectric conversion characteristic owing to the capability of efficient absorption for the incident light.

In addition, the organic photoelectric conversion element of the invention contains a light-to-light conversion material in the photoelectric conversion region. Owing to this measure, the light having a wavelength not absorbed by the electron donating organic material can be absorbed owing to the wavelength conversion performed by the light-to-light conversion material and be used for carrier generation. Accordingly, it becomes possible to obtain an organic photoelectric conversion element with a high conversion efficiency.

Further, the photoelectric conversion characteristic can be enhanced by stacking plural photoelectric conversion regions and making different from each other the maximum absorption wavelength of the electron donating organic material contained in each photoelectric conversion region.

According to first aspect of the present invention, an organic photoelectric conversion element comprises: at least two electrodes on a substrate; and a photoelectric conversion region provided between said electrodes, having at least an electron donating organic material and electron accepting material, wherein said photoelectric conversion region contains at least two or more electron donating organic materials. By using two or more electron donating materials each having a different absorption wavelength region, efficient absorption of the incident light is possible, and with such a configuration it becomes possible to provide a highly efficient organic photoelectric conversion element.

Preferably, the maximum absorption wavelengths of said two or more electron donating organic materials are different. By using two or more electron donating materials with different absorption wavelength regions, efficient absorption of incident light is possible, and with such a configuration it becomes possible to provide a highly efficient organic photoelectric conversion element.

Preferably, the two or more electron donating organic material are polymer materials each having a π-conjugate system. By using a π-conjugate system excelling in carrier transport capability as an electron donating organic material, the generating carriers can be effectively taken outside, thus enabling to provide a highly efficient organic photoelectric conversion element.

According to second aspect of the invention, an organic photoelectric conversion element comprises: at least two electrodes on a substrate; and a photoelectric conversion region provided between said electrodes, having at least an electron donating organic material and electron accepting material, wherein said photoelectric conversion region contains at least an light-to-light conversion material capable of converting the wavelength of light. With such a configuration, even the light having a wavelength not absorbed by the electron donating organic material can be absorbed owing to the wavelength conversion performed by the light-to-light conversion material, and utilized for carrier generation. Accordingly, it becomes possible to provide an organic photoelectric conversion element with a high conversion efficiency.

Preferably, the light-to-light conversion material is a fluorescence-emitting material or a phosphorescence-emitting material. By using a material with a high fluorescent quantum efficiency, it becomes possible to perform efficient light-to-light conversion, thus enabling to provide a highly efficient organic photoelectric conversion element.

Preferably, the light resulting from the wavelength conversion by the light-to-light conversion material is absorbed by the electron donating organic material. It becomes possible to effectively utilize the light that is originally not absorbed by the electron donating organic material but transmits it, and thus to provide a highly efficient organic photoelectric conversion element.

According to third aspect of the invention, an organic photoelectric conversion element comprises: at least two electrodes on a substrate; and a photoelectric conversion region provided between said electrodes, having at least an electron donating organic material and electron accepting material, wherein said photoelectric conversion region has at least two stacked layers, and wherein the maximum absorption wavelengths of the electron donating organic material contained in each photoelectric conversion region is different from each other. By stacking plural photoelectric conversion regions, an incident light that cannot be absorbed by a photoelectric conversion region can be absorbed by another photoelectric conversion region; thus, increase of light absorption as a whole becomes possible, leading to provision of a highly efficient organic photoelectric conversion element. Meanwhile, in the case of stacking plural photoelectric conversion regions, it is necessary to arrange an electrode between each photoelectric conversion region whereby light transmittance is requested for the individual electrode, for which a variety of metal thin films or ITO are preferably used.

According to fourth aspect of the invention, an organic photoelectric conversion element comprises: at least two electrodes on a substrate; and a photoelectric conversion region provided between said electrodes, having at least an electron donating organic material and electron accepting material, wherein said electron accepting material contains a fullerene compound and/or a carbon nano-tube compound. Since the electron transfer speed from the electron donating organic material to the electron accepting is very fast, the carrier separation efficiency is noticeably enhanced, leading to the provision of a highly efficient organic photoelectric conversion element.

Preferably, in the photoelectric conversion region, the electron donating organic material and the electron accepting material are mixed together. The photoelectric conversion region can be simply manufactured by coating a solution of the mixture, thus enabling area expansion and cost reduction.

DETAILED DESCRIPTION OF THE PREFERRED EMBODIMENTS

Figure 1:
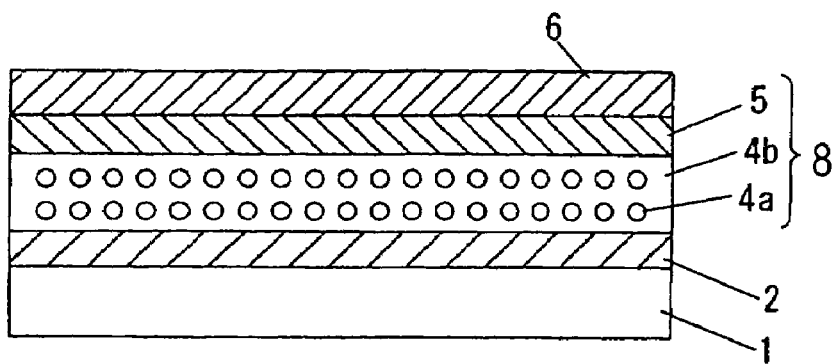
FIG. 1 is a cross-sectional view of the essential part of the organic photoelectric conversion element as Embodiment 1 practicing the invention.

In the following, the organic photoelectric conversion element according to the invention is described in detail.

The substrate used for the organic photoelectric conversion element of the invention is not specifically restricted so long as it is provided with sufficient mechanical and thermal strengths and can effectively transmit irradiated light.

For example, materials having a high transparency in the visible spectrum region may be used such as glass, poly (ethylene terephthalate), polycarbonate, poly(methyl methacrylate), polyether sulfone, poly(vinyl fluoride), polypropylene, polyethylene, polyacrylate, an amorphous polyolefin, and a fluorine-containing resin. An elastic flexible substrate made of those materials in the form of film may also be used. In the case where a polymer material is used, for the purpose of improving the humidity resistance of the material, it is effective to provide a thin film comprising various metals and metal oxides on the outer surface of the substrate in such an extent as not to deteriorate the transmittance of the substrate.

Further, depending on use application, materials provided with a light-to-light conversion capability of converting incident light to the one with a specified wavelength. Moreover, the substrate is not specifically, restricted though preferred to be insulating; within the range of not impeding the function of the organic photoelectric conversion element or depending on use application, the substrate may have electro-conductivity.

At least one of the electrodes for the organic photoelectric conversion element must transmit light, and the transmittance strongly affects the photoelectric conversion performance. Accordingly, as the anode of the aforementioned organic photoelectric conversion element, a so-called transparent electrode is usually used which is fabricated into the form of film by a sputtering method or an ion beam vapor deposition method using a material such as, for example, ITO, ATO (Sb-doped $SnO_2$), AZO (Al-doped ZnO). Moreover, by adopting an auxiliary electrode, a thin film of a metallic material such as, for example, Ag, a comparatively high resistive coating-type ITO, or various conductive polymer compounds such as PEDOT, PPV and polyfluorene can also be used.

As the electron donating organic material, polymers of phenylenevinylene, fluorene, carbazole, indole, pyrene, pyrrole, picoline, thiophene, acetylene and diacetylene, and derivatives thereof may be used. Moreover, the material is not restricted to polymers, but porphyrin compounds such as, for example, porphine, copper tetraphenylporphine, phthalocyanine, copper phthalocyanine, titaniumphthalocyanine oxide; aromatic tertiary amines such as 1,1-bis[4-(di-p-tolylamino)phenyl] cyclohexane, 4,4',4"-trimethyltriphenylamine, N,N,N',N'-tetraquis(p-tolyl)-p-phenylenediamine, 1-(N,N-di-p-tolylamino)naphthalene, 4,4'-bis(dimethylamino)-2-2'-dimethyltriphenylmethane, N,N,N',N'-tetraphenyl-4,4'-diaminobiphenyl, N,N'-diphenyl-N,N'-di-m-tolyl-4,4'-diaminobiphenyl, and N-phenylcarbzole; stilbene compounds such as 4-di-p-tolylaminostilbene, 4-(di-p-tolylamino)-4'-[4-(di-p-tolylamino)styryl] stilbene; triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, silazane derivatives, polysilane-based aniline copolymers, oligomers, styrylamine compounds, aromatic dimethylidyne-based compounds, and poly(3-methylthiophene) can also be used.

As the electron accepting material, fullerenes represented by C60 and C70 and carbon nano-tubes, and their derivatives, oxadiazole derivatives such as 1,3-bis(4-tert-butylphenyl-1,3,4-oxadiazolyl)phenylene (OXD-7), anthraquinodimethane derivatives, and diphenylquinone derivatives are used.

As the cathode, any material may be used so long as it can efficiently extract electric charges to an external circuit, including various metals such as Al, Au, Cr, Cu, In, Mg, Ni, Si and Ti, Mg alloys such as Mg—Ag and Mg—In ones and Al alloys such as Al—Li, Al—Sr, Al—Ba ones. In addition, to improve short-circuit current, countermeasures such as of introducing a metal oxide or metal fluoride between an organic layer and the cathode are preferably adopted.

As the manufacturing method for an organic photoelectric conversion element with use of the above-cited materials, any method may be adopted including various vacuum processes such as vacuum vapor deposition and sputtering, and wet processes such as spin-coating and dipping. These methods may be arbitrarily selected which are suited for the materials to be used and constitutions to be adopted.

In the following, some embodiments practicing the invention will be described.

Embodiment 1

An organic photoelectric conversion element as Embodiment 1 practicing the invention is described.

FIG. 1 is a cross-sectional view of the essential part of an organic photoelectric conversion element as the first embodiment of the invention. In FIG. 1, the constitution of a substrate 1, an anode 2, an electron accepting layer 5 and a cathode 6 is common to that for the conventional technique. The aspect in which the organic photoelectric conversion element of the present embodiment is different from the conventional technique is that the organic photoelectric conversion element is provided with an electron donating layer containing at least two or more electron donating organic materials 4a and 4b each differing in the absorption wavelength feature, wherein the electron donating layer and the electron accepting layer 5 function as a photoelectric conversion region 8.

Since the energy conversion efficiency of an organic photoelectric conversion element is sharply influenced by the absorption amount of the incident light, the light absorption characteristic of the photoelectric conversion region is extremely important. Not only matching the absorption spectrum to the spectrum of the incident light, for example, by changing the kind of the material to be used, but also increasing the layer thickness are effective to enhance the absorption amount of light energy.

However, in the case where, for example, an organic photoelectric conversion element is used as a solar cell, sunlight as the incident light has a broad wavelength range covering from the UV region to the near IR region. Therefore, it is quite difficult for only a single electron donating organic material to absorb the entire range of such light. Meanwhile, though thickening of a photoelectric conversion region can easily increase the light absorption amount, care must have been taken since layer thickening has a reverse effect of deteriorating the carrier extraction efficiency.

Thus, in the present embodiment, an electron donating layer is formed with use of two kinds of electron donating organic materials 4a and 4b, and by this countermeasure, absorption of light having a broad wavelength range has become possible, which has been very difficult with only one kind of electron donating organic material as in the conventional technique. In particular, by using a blend of plural π-conjugate polymer materials each having a different maximum absorption wavelength as the electron donating organic material, a highly efficient organic photoelectric conversion element can be provided since both of the absorption efficiency for the incident light and the carrier transport efficiency are improved.

An electron donating layer can be formed with three or more kinds of material whereby, by making the absorption wavelength characteristic of each electron donating organic material different, light of still broader wavelength range can be absorbed.

Embodiment 2

An organic photoelectric conversion element as Embodiment 2 practicing the invention is described.

Figure 2:
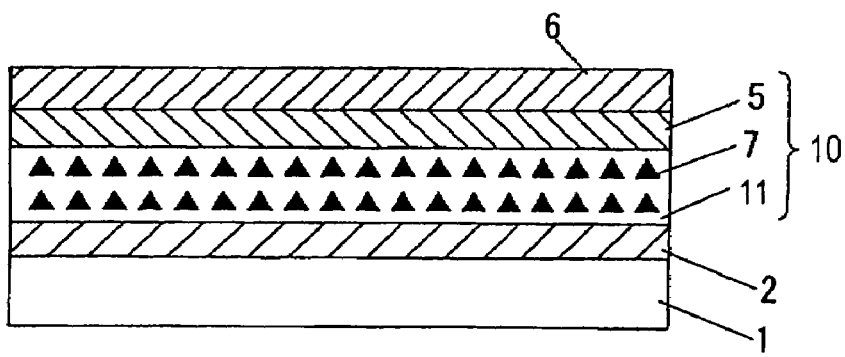
FIG. 2 is a cross-sectional view of the essential part of the organic photoelectric conversion element as Embodiment 2 practicing the invention.

FIG. 2 is a cross-sectional view of the essential part of an organic photoelectric conversion element as the second embodiment practicing the invention. In FIG. 2, the constitution of a substrate 1, an anode 2, an electron accepting layer 5 and a cathode 6 is common to that for the conventional technique.

The aspect in which the organic photoelectric conversion element of the present embodiment is different from the conventional technique is that the electron donating organic material 11 of the photoelectric conversion region 10 contains at least one kind of a light-to-light conversion material 7.

As has been stated previously, for the enhancement of the conversion efficiency of an organic photoelectric conversion element, it is indispensable to raise the absorption efficiency for the incident light. But it is not always possible to optimize the relation between the incident light spectrum and the absorption characteristic of the electron donating organic material. For example, direct absorption of light in the UV region is difficult from the practical viewpoint in consideration of the durability of the material. In such a situation, according to the invention, by incorporating a light-to-light conversion material 7 in the electron donating organic material 11 of the photoelectric conversion region 10, the wavelength of such harmful light is converted to one in the range which the electron donating organic material 11 can absorb.

In particular, under a situation where the spectral width of the incident light is narrow or the alteration of wavelength is difficult, such a method of matching the absorption characteristic of the photo-receptive part to the property of the incident light by means of the light-to-light conversion material 7 is an extremely effective tool for the enhancement of conversion efficiency.

As such a light-to-light conversion material 7, any material may be used so long as it can absorb the incident light more efficiently than electron donating organic material 11 and effectively transfer the excitation energy to electron donating organic material 11 or electron accepting layer 5. But, in order to achieve a high conversion efficiency, it is preferred to use a material which absorbs light with a wavelength shorter than that of the light absorbed by electron donating material 11, has a high fluorescent quantum efficiency, and has few thermal deactivation processes. As the light-to-light conversion material 7, for example, coumarin or Rhodamine can be used.

Embodiment 3

Figure 3:
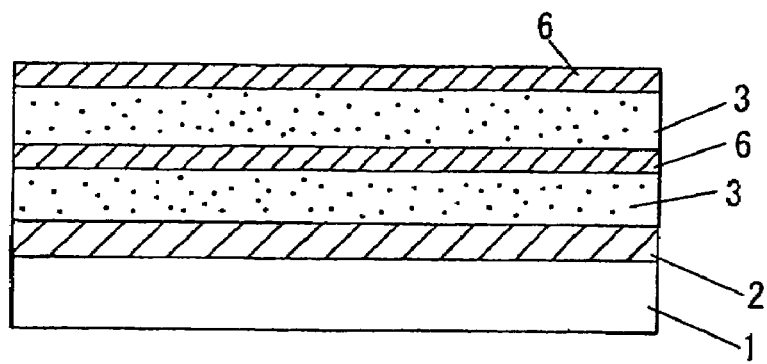
FIG. 3 is a cross-sectional view of the essential part of the organic photoelectric conversion element as Embodiment 3 practicing the invention.

An organic photoelectric conversion element as Embodiment 3 practicing the invention is described. FIG. 3 is a cross-sectional view of the essential part practicing an organic photoelectric conversion element as the third embodiment of the invention. In FIG. 3, 1 indicates a substrate, 2 an anode, 3 a photoelectric conversion region and 6 a cathode.

The aspect in which the organic photoelectric conversion element of the present embodiment is different from the conventional technique is that the photoelectric conversion region consists of at least two stacked layers and that the electron donating organic material contained in each photoelectric conversion region is different in the maximum absorption wavelength.

An element in which plural layers of a photoelectric conversion region 3 are stacked, and in which each photoelectric conversion region is connected in series can enhance the open-circuit voltage.

The conventional organic photoelectric conversion elements have plural photoelectric conversion regions made of the same material wherein the wavelength absorbable by each photoelectric conversion region is the same and wherein, accordingly, a marked improvement of light absorption efficiency cannot be expected.

But, since the organic photoelectric conversion element of the present embodiment has photoelectric conversion regions in the form of plural stacked layers each region having a different absorption wavelength, the light absorption quantity as a whole can be increased noticeably.

Meanwhile, as shown in FIG. 3, in the case where electrodes 6 are arranged between each photoelectric conversion region for the fabrication of a stacked structure of plural photoelectric conversion regions 3, the electrodes are required to have a sufficient level of transparency to light and function as both of anode and cathode. Further, electrodes 6 between each photoelectric conversion region 3 are provided depending on need.

Embodiment 4

An organic photoelectric conversion element as Embodiment 3 practicing the invention is described.

Figure 4:
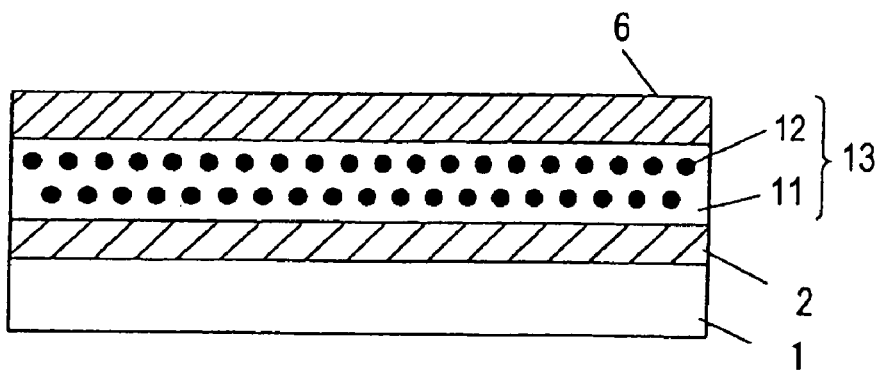
FIG. 4 is a cross-sectional view of the essential part of the organic photoelectric conversion element as Embodiment 4 practicing the invention.

FIG. 4 is a cross-sectional view of the essential part of an organic photoelectric conversion element as the fourth embodiment practicing the invention. In FIG. 4, the constitution of a substrate 1, a anode 2, an electron accepting layer 5 and a cathode 6 is common to that for the conventional technique.

The aspect in which the organic photoelectric conversion element of the present embodiment is different from the conventional technique is that the photoelectric conversion region 13, which comprises a mixture of an electron accepting material 12 containing a fullerene compound and/or a carbon nano-tube compound and an electron donating organic material 11, is provided with a pre-determined light-absorbing characteristic.

Here, the term 'mixture' indicates a state resulting from placing materials in the form of fluid or solid in a vessel and mixing them together by agitation, if necessary, upon the addition of a solvent. The term also includes a film prepared by, for example, spin-coating the matter prepared in the above-described manner.

Such a mixture-type organic photoelectric conversion element exhibits a comparatively high conversion efficiency in spite of a very simple configuration by virtue of the light absorption, excitation and electron transfer occurring in the entire volume of the photoelectric conversion region 13. And, by imparting the absorption characteristic and element configuration such as set forth in Embodiments 1 to 3, an organic photoelectric conversion element with a still further enhanced conversion efficiency can be prepared.

Figure 5:
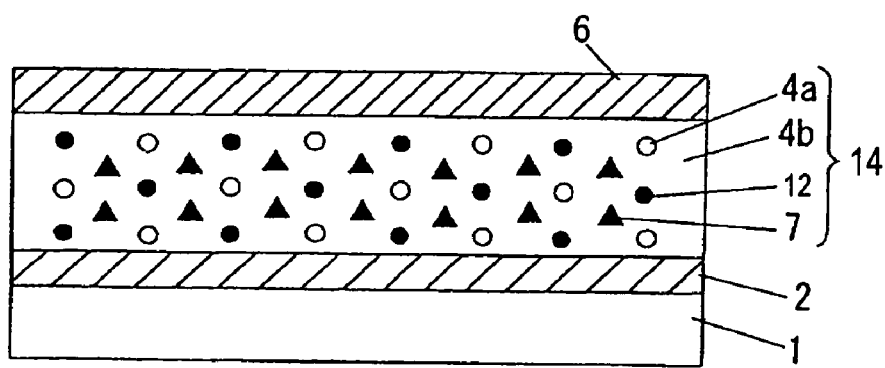
FIG. 5 is a cross-sectional view of the essential part of the organic photoelectric conversion element as Embodiment 4 practicing the invention.
Figure 6:
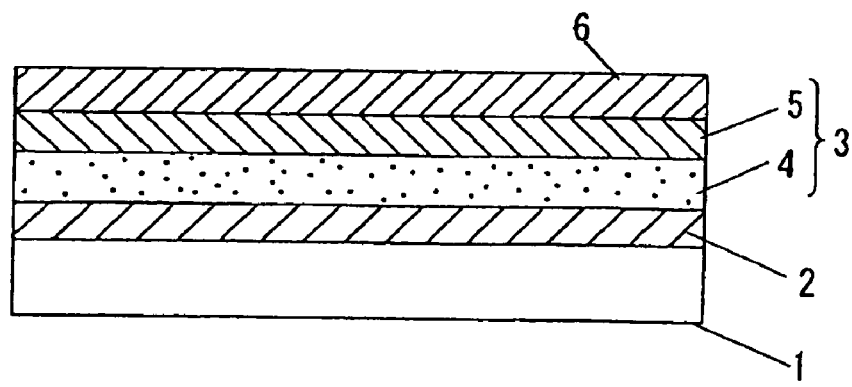
FIG. 6 is a cross-sectional view of the conventional organic photoelectric conversion element.

In particular, as shown in the cross-sectional view of the essential part of the organic photoelectric conversion element in Embodiment 4 practicing the invention depicted in FIG. 5, an organic photoelectric conversion element having a high conversion efficiency can be attained by using a mixture of plural electron donating organic materials 4a and 4b each having a different absorption wavelength characteristic, an electron accepting material 12 and further a light-to-light conversion material 7 for the photoelectric conversion region 14.

By way of precaution, the photoelectric conversion region described in Embodiments 1 to 4 maybe of a single layer structure or of a plural layer structure.

EXAMPLE

First of all, on a glass substrate which satisfies the properties for the invention, an ITO film with 150 nm thickness was formed by means of sputtering. Thereafter on the ITO film a resist film with 5 μm thickness was provided by spin-coating a resist material (OFPR-800 (trade mark) of Tokyo Ohka Kogyo Co., Ltd.). Then, via masking, exposure and development, the resist film was patterned into a pre-determined configuration. Then, after immersed in an 18 N aqueous hydrochloric acid kept at 60° C. to etch the ITO film at the portion where no resist film is present, this glass substrate was washed with water. Finally, by removing also the resist film, a glass substrate having a first electrode consisting of the ITO film in the pre-determined pattern was obtained.

Then, the glass substrate was subjected to ultrasonic rinsing with a detergent (Semico-clean (trade mark), a product of Furuuchi Chemical Corp.) for 5 min, ultrasonic rinsing with pure water for 10 min, ultrasonic rinsing for 5 min with a solution obtained by mixing 1 part (by volume)

of aqueous hydrogen peroxide and 5 parts of water with 1 part of aqueous ammonia, and ultrasonic rinsing with 70° C. purified water for 5 min successively in this order. Thereafter, the water adhering the glass substrate was removed with use of a nitrogen blower, and the substrate was dried by further heating to 250° C.

In succession, poly(3,4)ethylenedioxythiophene/polystyrene sulfonate (PEDT/PSS) was placed dropwise through a 0.45 μm pore size filter on the substrate thus prepared and uniformly spread by spin-coating. By heating the coated product in a clean oven kept at 200° C. for 10 min, a buffer layer was formed.

Next, the resulting product was spin-coated with a chlorobenzene solution of a mixture consisting of two electron donating polymer materials, i.e., poly(2-methoxy-5-(2'-ethylhexyloxy)-1,4-phenylenevinylene) (MEH-PPV) and poly (3-hexylthiophene) (P3HT) and [5,6]-phenyl C61 butylic acid methyl ester ([5, 6]-PCBM) with a mixing ratio of 2:1:8 in weight, and then subjected to heat treatment in an clean oven kept at 100° C. for 30 min to give a photoelectric conversion layer with roughly 100 nm thickness.

Finally, on this photoelectric conversion layer, LiF was deposited in about 1 nm thickness and then Al in about 10 nm thickness both in the form of film in a resistive heating vapor deposition apparatus evacuated to the degree of vacuum of 0.27 mPA ($=2\times10^{-6}$ Torr) or less. In this way, an organic photoelectric conversion element was fabricated.

Further, by bonding a glass plate on the top of this organic photoelectric conversion element by means of a photocrosslinking epoxy resin, an organic photoelectric conversion element was obtained which inhibits moisture invasion.

In addition, in a similar manner, another element fabricated with use of a chlorobenzene solution consisting of a single kind of electron donating polymer material, poly(2-methoxy-5-(2'-ethylhexyloxy)-1,4-phenylenevinylene) (MEH-PPV) and [5,6]-phenyl C61 butyric acid methyl ester ([5,6]-PCBM) with a mixing ratio of 1:4 in weight was also formed, and the photoelectric conversion characteristic was compared.

Evaluation of the photoelectric conversion characteristic of these elements revealed that, though open circuit voltage did not change, the short-circuit current Jsc of the element containing one kind of electron donating material was 5.0 mA/cm$^2$ and that of the element containing two kinds of electron donating materials was 5.6 mA/cm$^2$. Namely, the element containing two kinds of electron donating materials showed a larger short-circuit current, which means a higher conversion efficiency.

According to the invention, an organic photoelectric conversion element with a high photoelectric conversion efficiency can be provided by virtue of enhancing the light-absorbing property of the photoelectric conversion region in the organic photoelectric conversion element.

CROSS REFERENCE TO RELATED APPLICATION

This application is based upon and claims the benefit of priority of Japanese Patent Application No. 2003-193431 filed on Jul. 8, 2003, the contents of which are incorporated herein by reference in its entirety.

What is claim is:

1. An organic photoelectric conversion element comprising:
a first electrode;
a second electrode;
a photoelectric conversion region provided between said electrodes, having at least an electron donating organic layer and an electron accepting layer,
wherein said electron donating organic layer contains at least a light-to-light conversion material capable of converting the wavelength of light and an electron donating organic material.

2. The organic photoelectric conversion element set forth in claim 1, wherein said light-to-light conversion material is a fluorescence-emitting material.

3. The organic photoelectric conversion element set forth in claim 1, wherein light subjected to the wavelength conversion by said light-to-light conversion material is absorbed by said electron donating organic material.

4. The organic photoelectric conversion element set forth in claim 1,
wherein the wavelength of light absorbed by the electron donating organic material is different from the wavelength of light absorbed by the light-to-light conversion material.

5. The organic photoelectric conversion element set forth in claim 1,
wherein said light-to-light conversion material is a phosphorescence-emitting material.

6. An organic photoelectric conversion element comprising:
a first electrode;
a second electrode;
a first photoelectric conversion layer provided between said first electrode and said second electrode;
a second photoelectric conversion layer provided between said first electrode and said second electrode; and
a third electrode provided between said first photoelectric conversion layer and said second photoelectric conversion layer,
wherein the maximum absorption wavelength of each of said first photoelectric conversion layer and said second photoelectric conversion layer is different from each other.

7. The organic photoelectric conversion element set forth in claim 6 wherein, each of said first photoelectric conversion layer and said second photoelectric conversion layer comprises a mixture of an electron donating organic material and an electron accepting material.

8. An organic photoelectric conversion element comprising:
a first electrode;
a second electrode;
a photoelectric conversion layer provided between said first electrode and said second electrode;
wherein said photoelectric conversion layer contains a first electron donating organic material and an electron accepting material.

9. The organic photoelectric conversion element set forth in claim 8,
wherein said photo electric conversion layer comprises a mixture of said first electron donating organic material and said electron accepting material.

10. The organic photoelectric conversion element set forth in claim 8,
wherein said photoelectric conversion layer further contains a second electron donating organic material, said second electron donating material having a different absorption wavelength characteristic from said first electron donating material.

11. The organic photoelectric conversion element set forth in claim 10,
wherein said photoelectric conversion layer comprises a mixture of said first electron donating organic material, said second electron donating material and said electron accepting material.

12. The organic photoelectric conversion element set forth in claim 10,
wherein said photoelectric conversion layer further contains a light-to-light conversion material.

13. The organic photoelectric conversion element set forth in claim 12,
wherein said photoelectric conversion layer comprises a mixture of said first electron donating organic material, said second electron donating material, said electron accepting material and said light-to-light conversion material.

14. An organic photoelectric conversion element comprising:
a first electrode;
a second electrode;
a photoelectric conversion region provided between said electrodes, having at least an electron donating organic layer,
wherein said electron donating organic layer contains at least two electron donating organic materials.

15. The organic photoelectric conversion element set forth in claim 14,
wherein the maximum absorption wavelengths of said electron donating organic materials are different.

16. The organic photoelectric conversion element set forth in claim 15,
wherein said photoelectric conversion region further comprises an electron accepting material.

17. The organic photoelectric conversion element set forth in claim 16,
wherein said electron accepting material contains a fullerene compound and a carbon nano-tube compound.

18. The organic photoelectric conversion element set forth in claim 16,
wherein said electron accepting material contains a fullerene compound.

19. The organic photoelectric conversion element set forth in claim 16,
wherein said electron accepting material contains a carbon nano-tube compound.

20. The organic photoelectric conversion element set forth in claim 14,
wherein said electron donating organic materials are polymer materials each having a pi conjugate system.

21. The organic photoelectric conversion element set forth in claim 20,
wherein said photoelectric conversion region further comprises an electron accepting material.

22. The organic photoelectric conversion element set forth in claim 21,
wherein said electron accepting material contains a fullerene compound and a carbon nano-tube compound.

23. The organic photoelectric conversion element set forth in claim 21,
wherein said electron accepting material contains a fullerene compound.

24. The organic photoelectric conversion element set forth in claim 21,
wherein said electron accepting material contains a carbon nano-tube compound.

* * * * *